United States Patent [19]
Yamashita et al.
[11] 3,818,377
[45] June 18, 1974

[54] OSCILLATORY DEVICE UTILIZING PULSE GENERATING DIODE

[75] Inventors: Sadahiko Yamashita; Toshi Anbe; Yjiro Koike, all of Osaka, Japan
[73] Assignee: Matsushita Electric Industrial Company Limited, Osaka, Japan

[22] Filed: July 27, 1972
[21] Appl. No.: 275,548

Related U.S. Application Data
[63] Continuation-in-part of Ser. No. 72,979, Sept. 17, 1970.

[30] Foreign Application Priority Data

| | | |
|---|---|---|
| Sept. 19, 1969 | Japan | 44-76058 |
| Sept. 20, 1969 | Japan | 44-74765 |
| Sept. 20, 1969 | Japan | 44-75574 |
| Sept. 20, 1969 | Japan | 44-75578 |
| Sept. 20, 1969 | Japan | 44-75579 |
| Jan. 28, 1970 | Japan | 45-8300 |
| Jan. 28, 1970 | Japan | 45-8301 |
| Jan. 30, 1970 | Japan | 45-8776 |
| June 15, 1970 | Japan | 45-52189 |

[52] U.S. Cl. 332/16 R, 307/271, 307/317, 317/235 T, 331/107 R, 332/52
[51] Int. Cl. H03c 3/22
[58] Field of Search 332/9 R, 16 R, 52; 317/235 T; 331/107 R; 307/260, 270, 317

[56] References Cited
UNITED STATES PATENTS

| | | | |
|---|---|---|---|
| 3,451,011 | 6/1969 | Uenohara | 332/16 X |
| 3,668,555 | 6/1972 | Kasperkovitz | 331/107 R |
| 3,680,059 | 7/1972 | Yamashita | 331/107 R |

*Primary Examiner*—Alfred L. Brody

[57] ABSTRACT

A pulse frequency modulator comprising a pulse generating diode which oscillates thereby to produce a pulse train when subjected to a bias voltage larger than a threshold voltage thereof, the repetition rate of the pulse train being varied in accordance with variation of the bias voltage, means for impressing the bias voltage on the diode, means for superposing on the bias voltage a voltage signal so as to pulse-frequency-modulate the pulse train, and means for deriving for utilization the pulse-frequency-modulated pulse train.

3 Claims, 9 Drawing Figures

OSCILLATORY DEVICE UTILIZING PULSE GENERATING DIODE

This application is a continuation-in-part of patent application Ser. No. 72,979 filed Sept. 17, 1970.

The present invention relates to circuit arrangements and more particularly to a pulse frequency modulator using an semiconductor oscillatory diode. The specific purpose of the invention is to provide a simple and economical pulse frequency modulator.

Generally the pulse frequency modulator of the invention includes a semiconductor pulse generating diode which oscillates in a relatively low frequency when a bias voltage larger than a threshold level is impressed on the diode. The frequency of the oscillation of the diode is varied from about 10 KHz to about $10^2$ KHz in dependence on variation a bias voltage applied to the diode.

The specific structure of the invention will be understood when the detailed description is read in conjunction with the drawings wherein.

Figure 5:
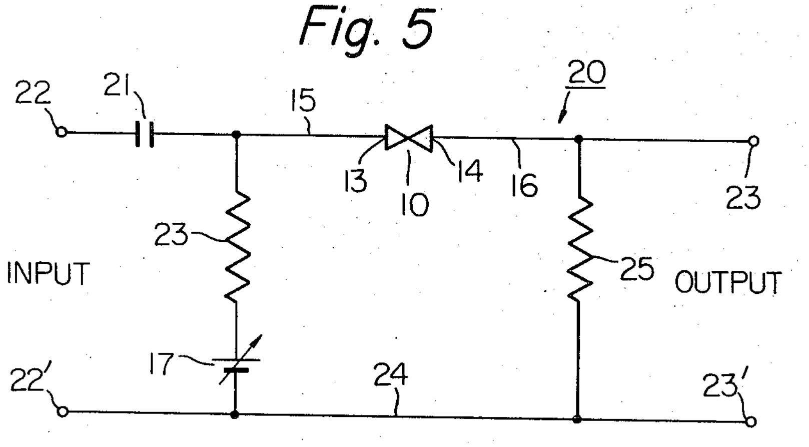
FIG. 5 is view a preferred embodiment of a modulator according to the invention.
Figure 6A:
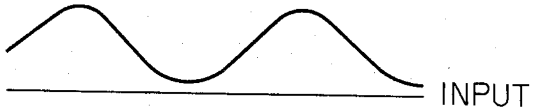
Figure 6B:
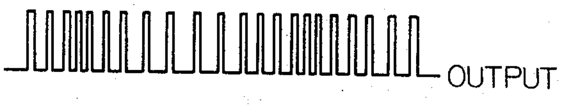

FIGS. 6(a) and 6(b) are views showing waveforms of input and output signals of the modulator of FIG. 5.

Figure 7:
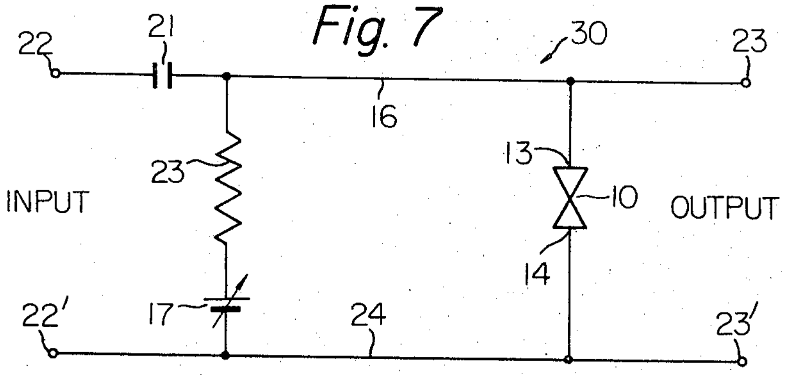

FIG. 7 is a view showing another embodiment of the modulator according to the invention.

Figure 8:
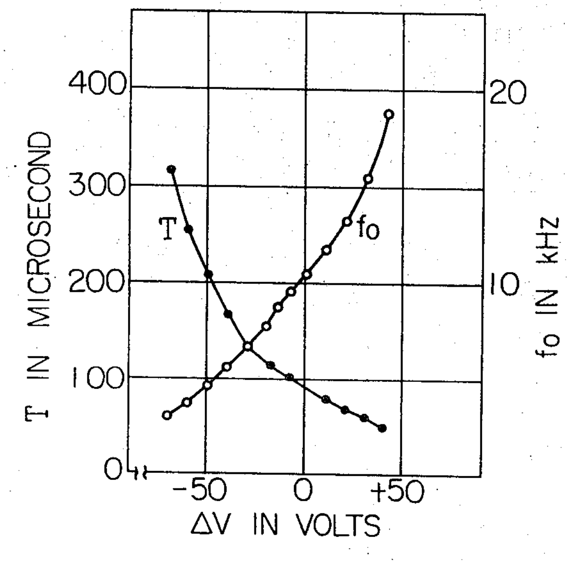

FIG. 8 is a graphic illustration of characteristics of a modulator of the invention.

Like elements are designated by like reference numerals in the views.

Before describing more specifically the concept of the invention, it will be helpful to discuss the principle of the oscillation mechanism of the pulse generating diode.

Figures 1, 2, 3:
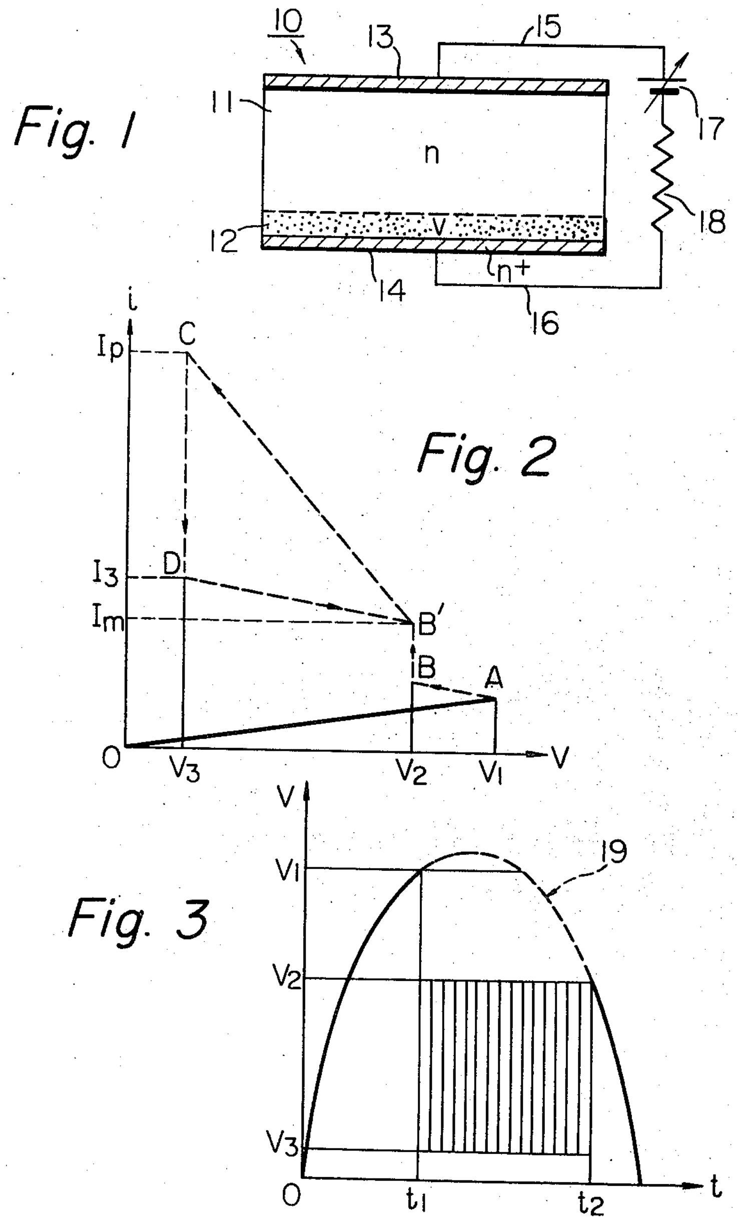
FIG. 1 is a sectional view of a pulse generating diode employed in the invention modulator.
FIGS. 2, 3 and 4 are illustrative graphs explaining the principle of the oscillation mechanism achievable with the pulse generating diode of FIG. 1.

FIG. 1 illustrates a pulse generating or oscillatory diode 10 utilized for this invention, which comprises an *n*-layer 11 composed of n-GaAs having a carrier concentration of from $10^{15}$ to $10^{16}$ per cubic centimeter. A $\nu$-layer 12 is formed on the *n*-layer 11 by doping iron impurity. The doped iron impuriy provides acceptor levels within the forbidden gap of the energy band structure of the GaAs crystals. The acceptor levels are so deep that the acceptor levels are filled with electrons, or majority carriers from the conduction band with the result that the carrier concentration of the $\nu$-layer 12 is reduce to one-tenth as high as that of the *n*-layer 11. On the $\nu$-layer 12 is formed an ohmic electrode 14 which serves as an $n^+$-layer. The electrode 14 is composed of a metallic material which ohmically contacts with n type gallium arsenide, such as, indium, tin, gold-germanium alloy, tin-silver alloy, indium-silver alloy, indium-gold alloy, germanium-gold-silver alloy, tin-germanium-silver alloy, indium-germanium-silver alloy, and gold-indium-germanium alloy. To the *n*-layer 11 is ohmically in contact with an electrode 13 which may be composed of the same material as the electrode 14 and is connected through a line 15 to a positive terminal of a d.c. electrical power source 17 of a voltage $V_b$. A negative terminal of the source 17 is connected through a line 16 and a resistor 18 to the $n^+$-layer 14. When the bias voltage $V_b$ is sufficiently high, the diode 10 oscillates by itself with the result that repetition pulse train is produced across the resistor 18.

Referring to FIG. 2, the operation of the pulse oscillator 10 is explained in detail.

When the reverse bias voltage applied to the oscillator from the source 17 is small, a certain number of carrier electrons in the conduction band of the $\nu$-layer 12 are trapped at the acceptor levels so that the carrier concentration of the $\nu$-layer 12 is apparently one-tenth of the *n*-layer 11 as described hereinbefore. Accordingly, the current through the diode 10 is small and proportionate to the bias voltage as the bias voltage is small.

As the bias voltage is sufficiently increased, the electrons trapped at the acceptor levels in the $\nu$-layer 12 are released and returned to the conduction band. In this instance, the acceptor levels become recombination generation centers so that the carrier concentration of the $\nu$-layer 12 increases whereby a space-charge limited current flows through the diode 10 which current is proportional to a square value of the bias voltage.

When the bias voltage exceeds a threshold voltage $V_1$, an avalanche breakdown takes place in the $\nu$-layer 12, which results in generating a great number of electron-hole pairs. The holes of the thus generated electron-hole pairs are trapped at the acceptor levels so that the distribution of the recombination centers is distorted, whereby the conductivity of the $\nu$-layer 12 is reduced until the state of the diode 10 become to a state (B') where the current through the diode 10 is equal to a critical current $I_m$ and the voltage across the diode 10 is equal to a sustaining voltage $V_2$. In this instance, most of the acceptor levels are filled with the holes so that the barrier height in the $\nu$-layer 12 is reduced whereby the avalanche breakdown is promoted so that the state of the diode 10 becomes to a state (C) wherein the current therethrough is equal to a peak current $I_p$ and the voltage thereacross is near to a voltage $V_3$. The voltage $V_3$ is so small that the avalanche breakdown is surpressed, whereby the state of the diode 10 becomes to a state (D) wherein the current is equal to a current $I_3$ and the voltage is equal to the voltage $V_3$. On the other hand, the holes trapped at the acceptor levels are emitted and therefore the state of the diode 10 returns to the initial state (B'). As far as the bias voltage applied to the diode 10 is maintained above the sustaining voltage $V_2$, the cycle B'-C-D is repeated, which results in generation of a continuous pulse oscillation.

It is now apparent that the repetition rate of the oscillation is defined by the duration from trapping to emission of the holes at the acceptor levels. The frequency of this pulse oscillation is the order of KHz and the pulse generated in the oscillation has a pulse width of the order $10^{-7}$ to $10^{-10}$ seconds.

In this instance, it should be understood that a ratio of the threshold voltage $V_1$ to the sustaining voltage $V_2$ is proportional to a ratio of $\sigma_p/\sigma_n$, where $\sigma_p$ and $\sigma_n$ respectively represent capture cross sections for hole and electron of the acceptor levels.

Another $\nu$-layer may be provided in the *n*-layer 11 so as to make the device bilaterally operative. The thickness of the $\nu$-layer is lower than 20 $\mu$m and preferably lower than 10 $\mu$m.

FIG. 3 is a plot of a voltage V appearing across the diode 10 against time *t*, when the magnitude of the bias voltage $V_b$ is sinusoidally change during a half cycle. As shown, the voltage V increases with increasing bias voltage $V_b$. At the time $t_1$ when $V_b$ reaches $V_1$, the diode 10 starts to oscillate, so that the voltage V cyclically varies between $V_2$ and $V_3$, as described in connection with FIG. 2.

However, as is shown by the dotted line 19 of FIG. 3, even if the bias voltage $V_b$ is decreased below the threshold voltage $V_1$, the diode 10 does not cease to oscillate. For the diode 10 to cease oscillation, it is necessary to lower the bias voltage $V_b$ below the sustaining voltage $V_2$. It is to be understood, in this connection, that a hysteresis phenomenon can be observed in this pulse generating diode 10.

Figure 4:
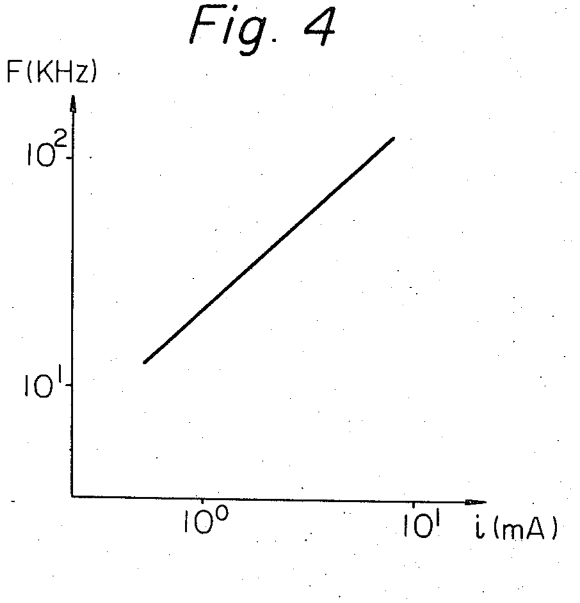

The relationship between the frequency F and the current *i* flowing through the pulse generating diode 10 is obtained from our experiment and is shown in FIG. 4. The frequency of this diode is found to depend substantially linearly upon the current flow in a selected operating region.

This diode may be characterized as follows. (1) The upper limit of the repetition rate is determined by the property of the diode itself, and the lower limit is reduced by increasing the RC time constant of the external circuit. (2) The pulse-repetition rate is the order of KHz and is varied by a d.c. bias current of the order of ten. (3) A large output voltage of up to 50 volts (for a 50 ohm resistive load) is obtained with a pulse width of a few nanosecond.

FIG. 5 shows a modulator 20 according to the invention which comprises a pulse generating diode 10 same as the diode shown in FIG. 1, having two electrodes 13 and 14. The electrode 13 is connected through a line 15 to one terminal of coupling capacitor 21 the other terminal of which is connected to one input terminal 22. The line 15 is further connected to one terminal of a protective resistor 23 the other terminal of which is connected to a positive terminal of a bias d.c. power source 17. The d.c. source 17 preferably has a variable voltage. A negative terminal of the d.c. source 17 of a voltage $V_b$ is connected to a base line 24 which is connected to the other input terminal 22' and in turn connected to one output terminal 23'. The electrode 14 of the diode 10 is connected through a line 16 to the other output terminal 23. A load resistor 25 connects the lines 16 and 24. The load resistor 25 may be, of course, an inductor.

When, in operation, the voltage $V_b$ of the power source 17 is maintained so that a voltage larger than the threshold voltage $V_1$ of the diode 10 impressed across the diode 10, the diode 10 commences to oscillate as described above, whereby a pulsating current flows through the power source 17, the protective resistor 23, the diode 10 and the load resistor 24. A pulsating voltage or a pulse train, therefore, appears across the output terminals 23 and 23'. When, in this instance, a voltage signal $\Delta V$ having a waveform as shown in FIG. 6(a) is applied across the input terminals 22 and 22' and is superposed through the coupling capacitor 21 on the voltage impressed across the diode 10, the voltage across the diode 10 fluctuates above the voltage $V_1$ as shown in FIG. 6(A), whereby the repetition rate of the output signal appearing across the output terminals 23 and 23' is varied in accordance with the fluctuation of the voltage across the diode 10 as shown in FIG. 6(b). Namely, the input signal having the waveform as shown in FIG. 6(a) is converted into the pulse signal having a repetition rate fluctuating in accordance with the voltage of the input signal, viz., the pulse signal produced by the diode 10 is pulse-frequency-modulated by the input voltage signal. The pulse-frequency-modulated signal may be delivered through the output terminals 23 and 23' to another circuit such as an amplifier. It should be understood that the input voltage signal may be a pulse train consisting of pulses having various amplitudes.

In FIG. 7, another modulator 30 according to the invention is shown, which has the same construction as the embodiment of FIG. 5 except that the load resistor 25 is omitted and the output terminals 23 and 23' are connected across the both terminals 13 and 14 of the diode 10. The modulator of FIG. 7 has the same function as the modulator of FIG. 5, so that a pulse-frequency-modulated signal appears across the output terminals 23 and 23' of the modulator 30 when an input signal having a fluctuating voltage.

FIG. 8 graphically shows repetition rates of the output signal of the modulator 20 in terms of the input voltage $\Delta V$ applied to the input terminals 22 and 22' when the voltage of the power source 17 is 150V, the resistance of the protective resistor 23 is 10 KΩ and the resistance of the load resistor 25 is 50Ω.

It should be now appreciated that the modulator according to the invention can serve as a pulse position modulator and an analogue-digital converter.

It will be understood that the invention is not to be limited to the exact construction shown and described and that various changes and modifications may be made without departing from the spirit and scope of the invention, as defined in the appended claims.

What is claimed is:

1. In a device for generating pulses at variable frequency including an oscillatory loop including a pulse generating diode having an *n*-layer and a higher resistive *ν*-layer doped with an impurity causing thereto reduction of conductivity, said diode generating pulses at a given repetition frequency when the voltage applied thereto exceeds the oscillation starting voltage due to the avalanche multiplication and trapping of carriers in deep impurity centers, a DC power source connected in series with said diode for applying to said diode a bias voltage, and a protective resistance inserted between said diode and said DC power source, the improvement comprising:

a. input means for superimposing a unidirectional input voltage of continuously varying amplitude on said bias voltage for causing said repetition frequency to vary;

b. output means connected to said oscillatory loop; and c. said bias voltage having a value higher than said oscillation starting voltage.

2. The improvement of claim 1, wherein said oscillatory loop further includes a load impedance connected in series with said pulse generating diode and said output means is connected across said load impedance.

3. The improvement of claim 1, wherein said output means is connected across said pulse generating diode.

* * * * *